United States Patent
Ooi et al.

(10) Patent No.: US 6,975,095 B2
(45) Date of Patent: Dec. 13, 2005

(54) REMAINING BATTERY CAPACITY COMPUTATION SYSTEM

(75) Inventors: Kozo Ooi, Sumoto (JP); Masao Yamaguchi, Sumoto (JP); Mikitaka Tamai, Tsunagun (JP)

(73) Assignee: Sanyo Electric Co., Ltd., Osaka (JP)

( * ) Notice: Subject to any disclaimer, the term of this patent is extended or adjusted under 35 U.S.C. 154(b) by 226 days.

(21) Appl. No.: 10/720,090

(22) Filed: Nov. 25, 2003

(65) Prior Publication Data

US 2004/0104706 A1   Jun. 3, 2004

(30) Foreign Application Priority Data

Nov. 29, 2002 (JP) .............................. 2002-348994

(51) Int. Cl.[7] .............................................. H02J 7/00
(52) U.S. Cl. ...................... 320/132; 320/133; 320/134; 320/136; 702/63
(58) Field of Search ................................ 320/125, 127, 320/133, 132, 134, 136, 162; 702/63

(56) References Cited

U.S. PATENT DOCUMENTS

| | | | | |
|---|---|---|---|---|
| 5,541,489 A | * | 7/1996 | Dunstan | 320/134 |
| 5,606,242 A | * | 2/1997 | Hull et al. | 320/106 |
| 5,982,147 A | * | 11/1999 | Anderson | 320/132 |
| 6,107,779 A | * | 8/2000 | Hara et al. | 320/132 |
| 6,107,780 A | * | 8/2000 | Kellerman | 320/132 |
| 6,163,132 A | * | 12/2000 | Higuchi et al. | 320/132 |
| 6,411,829 B1 | * | 6/2002 | Takenaka | 455/573 |
| 6,522,361 B2 | * | 2/2003 | Higuchi et al. | 348/372 |
| 6,646,421 B2 | * | 11/2003 | Kimura et al. | 320/132 |
| 2004/0027091 A1 | * | 2/2004 | Hashimoto | 320/104 |

FOREIGN PATENT DOCUMENTS

JP            9-233413            9/1997

* cited by examiner

Primary Examiner—Michael Sherry
Assistant Examiner—Samuel Berhanu
(74) Attorney, Agent, or Firm—Wenderoth, Lind & Ponack, L.L.P.

(57) ABSTRACT

The remaining battery capacity computation system has a remaining capacity computation apparatus, which is connected to an electrical equipment unit via a one line communication circuit. The connected electrical equipment unit transmits a detected current signal, that indicates current flowing in the battery, at a fixed transmission period to the remaining capacity computation apparatus via the communication circuit. The remaining capacity computation apparatus computes remaining battery capacity from the detected current, and outputs a signal, that indicates the computed remaining capacity, with prescribed timing to the communication circuit. The remaining capacity signal is transmitted to the connected electrical equipment unit and timed after completion of the output of one detected current signal and before commencement of the output of the next detected current signal.

20 Claims, 2 Drawing Sheets

REMAINING BATTERY CAPACITY COMPUTATION SYSTEM

This application is based on Application No. 348994 filed in Japan on Nov. 29, 2002, the content of which is incorporated hereinto by reference.

BACKGROUND OF THE INVENTION

This invention relates to a remaining capacity computation system wherein a connected electrical equipment unit detects current, the detected current is sent to a remaining capacity computation apparatus via a communication circuit, the remaining capacity computation apparatus computes remaining capacity from the received current, and the computed remaining capacity is sent to the connected electrical equipment unit via the communication circuit. In particular, this invention relates to a remaining capacity computation system wherein the connected electrical equipment unit and the remaining capacity computation apparatus are connected by a one line communication circuit.

Accurate computation of remaining battery capacity for portable electrical equipment using a battery as a power supply allows their convenient use. In particular, for proper operation of equipment such as a laptop computer, a prescribed shutdown procedure and power-down is required prior to complete battery discharge. Remaining battery capacity is computed by integrating charging current and discharging current flowing through the battery. The integrated value of charging current is added to the remaining capacity, and the integrated value of discharging current is subtracted from the remaining capacity.

To realize this, a system has been developed which provides a current detection section in the connected electrical equipment unit, and a remaining capacity computation section in the battery pack which houses the battery. In this system, the remaining capacity computation section contained in the battery pack accurately computes remaining battery capacity with high precision. This is because the remaining capacity computation section calculates remaining capacity of the battery under optimum conditions. Further, since the current detection section is housed in the connected electrical equipment unit, this system has the characteristic that the battery pack, which is discarded when it becomes unusable, can be made inexpensively. However, this system requires communication between the connected electrical equipment unit and the remaining capacity computation section. This is because the connected electrical equipment unit sends a current signal to the remaining capacity computation section, and the remaining capacity computation section computes and sends a remaining capacity signal to the connected electrical equipment. To keep the communication circuit as simple as possible, it is necessary to send the detected current signal and the remaining capacity signal in both directions via a one line communication circuit. However, a one line communication circuit cannot send the detected current signal and the remaining capacity signal at the same time. For example, the remaining capacity signal can be sent in the following manner.

(1) A detected current signal is sent from the connected electrical equipment unit to the remaining capacity computation section at fixed periodic intervals, and a request signal is issued whenever the remaining capacity is needed. When the remaining capacity computation section receives a request signal, it sends a remaining capacity signal to the connected electrical equipment unit.

(2) A detected current signal is sent from the connected electrical equipment unit to the remaining capacity computation section at fixed periodic intervals, while the remaining capacity computation section sends a remaining capacity signal to the connected electrical equipment unit at fixed periodic intervals without depending on a request signal.

However in system (1) described above, there are times when the signal to send detected current from the connected electrical equipment unit to the remaining capacity computation section and the signal to request output of remaining capacity can be sent simultaneously. In system (2) as well, the detected current signal from the connected electrical equipment unit and the remaining capacity signal from the remaining capacity computation section can be output at the same time. Consequently, while accurate battery current can be detected, the remaining capacity signal cannot be reliably sent to the connected electrical equipment unit.

SUMMARY OF THE INVENTION

The present invention was developed to further resolve these types of drawbacks. Thus it is a primary object of the present invention to provide a remaining battery capacity computation system which can reliably transmit a current signal and remaining capacity signal in two directions via a one line communication circuit, accurately compute remaining capacity with a remaining capacity computation section, and reliably transmit computed remaining capacity to a connected electrical equipment unit.

The above and further objects and features of the invention will more fully be apparent from the following detailed description with accompanying drawings.

In the remaining battery capacity computation system of the present invention, a remaining capacity computation apparatus is connected to an electrical equipment unit via a one line communication circuit. The connected electrical equipment unit detects current flowing in the battery and sends that detected current value to the remaining capacity computation apparatus via the communication circuit. The remaining capacity computation apparatus computes remaining battery capacity from the detected current sent via the communication circuit, and sends the computed remaining capacity to the connected electrical equipment unit via the communication circuit. The connected electrical equipment unit is provided with a current detection section which detects current flowing in the battery and outputs the detected current signal at transmission intervals of fixed period to the communication circuit to transmit the signal to the remaining capacity computation apparatus, and a remaining capacity receiving section which receives the remaining capacity signal input from the remaining capacity computation apparatus. The remaining capacity computation apparatus is provided with a remaining capacity computation section which computes remaining battery capacity by operating on the detected current signal input from the connected electrical equipment unit via the communication circuit, and a communication processing section which outputs with prescribed timing a remaining capacity signal representing remaining battery capacity computed by the remaining capacity computation section to the communication circuit to transmit the signal to the connected electrical equipment unit. The communication processing section provided in the remaining capacity computation apparatus transmits remaining capacity to the connected electrical equipment unit by timing signal output to the communication circuit to be after completion of transmission of one detected current signal and before commencement of transmission of the next detected current signal sent from the connected electrical equipment unit to the communication circuit.

The remaining capacity computation system described above has the characteristic that a current signal and remaining capacity signal can be reliably transmitted in two directions via a one line communication circuit. Remaining capacity can be computed by the remaining capacity computation apparatus connected to the electrical equipment unit, and that computed remaining capacity can be reliably transmitted to the connected electrical equipment unit via the communication circuit. This is because the current detection section provided in the connected electrical equipment unit detects current flowing in the battery, and sends the detected current signal via the communication circuit with a fixed transmission period to the remaining capacity computation apparatus. The remaining capacity computation apparatus is provided with a remaining capacity computation section to operate on the detected current signal and compute remaining battery capacity, and a communication processing section to output with prescribed timing a remaining capacity signal representing remaining battery capacity computed by the remaining capacity computation section. The communication processing section sends the remaining capacity signal to the connected electrical equipment unit via the communication circuit with signal timing to be after completion of transmission of one detected current signal and before commencement of transmission of the next detected current signal sent from the connected electrical equipment unit.

In the remaining capacity computation system of the present invention, the remaining capacity computation apparatus can be housed in a battery pack which attaches to an electrical equipment unit in a detachable fashion.

This remaining capacity computation system has the characteristic that since the remaining capacity computation apparatus is housed in a battery pack and the current detection section is housed in a connected electrical equipment unit, it is not necessary for the battery pack, which is discarded when it becomes unusable, to contain the current detection section. This allows accurate determination of remaining capacity while allowing inexpensive battery pack production in quantity. This is because component cost and production cost can be reduced by housing a remaining capacity computation apparatus, which can accurately determine remaining battery capacity, in the battery pack containing the battery, and by not housing a current detection section in the battery pack, which is discarded when it becomes unusable. The connected electrical equipment unit is provided with a remaining capacity display section, and this remaining capacity display section can display remaining capacity received by the remaining capacity receiving section. The current detection section can send charging current and discharging current to the remaining capacity computation apparatus via the communication circuit by changing the sign of the detected current signal. The transmission period of the detected current signal output from the current detection section to the communication circuit can be 100 msec to 10 sec. The communication processing section can output one remaining capacity signal to the communication circuit after receiving a plurality of detected current signals. The current detection section can average detected current over the transmission period and send an averaged current signal to the remaining capacity computation section via the communication circuit.

DETAILED DESCRIPTION OF THE INVENTION

Figure 1:
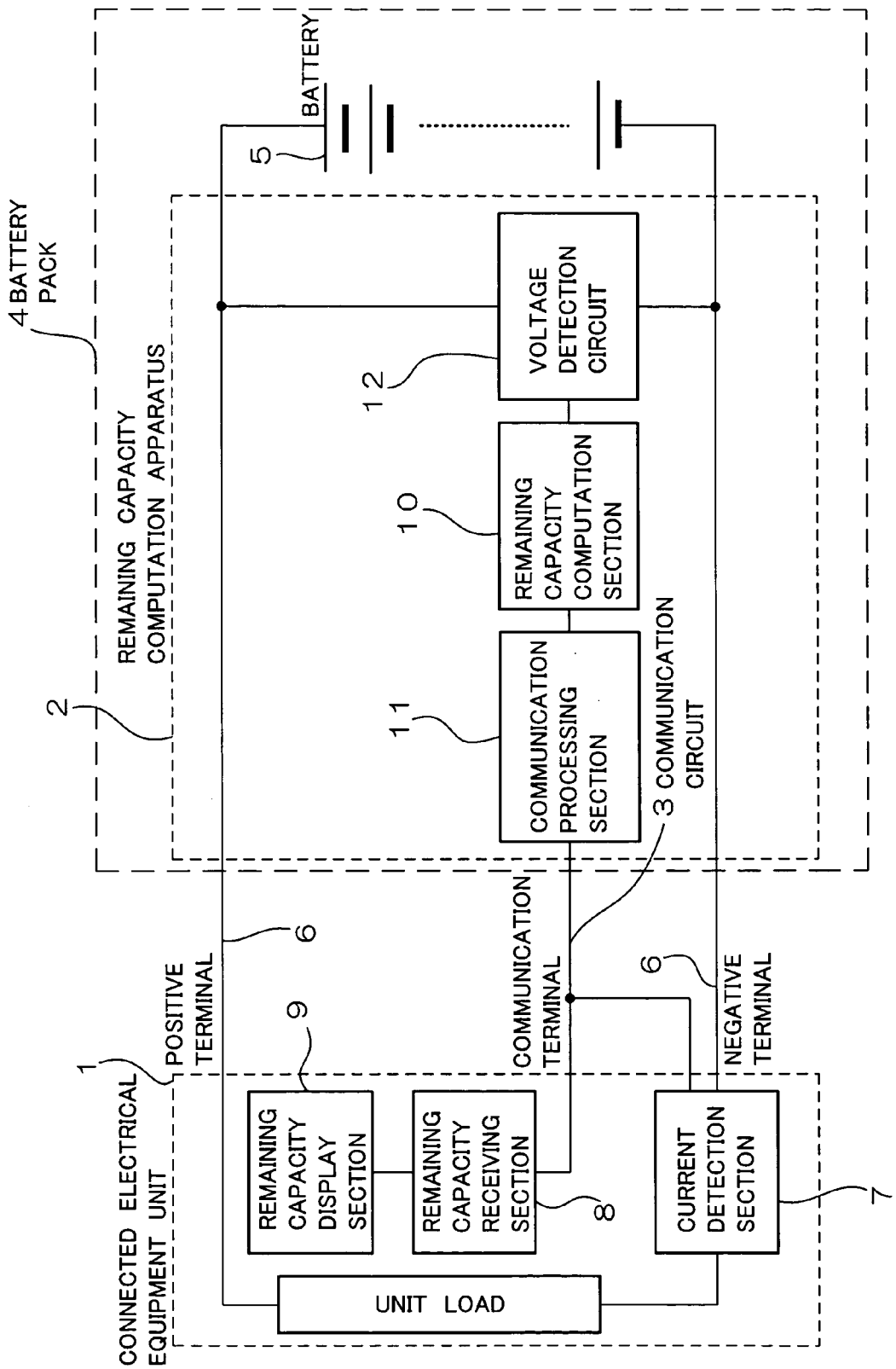
FIG. 1 is a block diagram of a remaining battery capacity computation system as an embodiment of the present invention.

In the remaining battery capacity computation system shown in FIG. 1, a remaining capacity computation apparatus 2 is connected to an electrical equipment unit 1 via a one line communication circuit 3. The remaining capacity computation system shown in the figure has the remaining capacity computation apparatus 2 housed in a battery pack 4, which is attached to the electrical equipment unit 1 in a detachable fashion. The battery pack 4 houses a rechargeable battery 5, and positive and negative power supply terminals 6, which are connected to the battery 5, as well as the one line communication circuit 3 are connected to the electrical equipment unit 1. However, in the remaining capacity computation system of the present invention, the remaining capacity computation-apparatus is not necessarily always housed in the battery pack, and the remaining capacity computation apparatus may be provided as a separate circuit from the battery pack.

In the remaining capacity computation system of the figure, current flowing in the battery 5 is detected at the connected electrical equipment unit 1, and a detected current signal is transmitted to the remaining capacity computation apparatus 2 via the communication circuit 3. The remaining capacity computation apparatus 2 operates on the detected current signal sent via the communication circuit 3 to compute remaining capacity of the battery 5, and transmits a computed remaining capacity signal to the connected electrical equipment unit 1 via the communication circuit 3.

The connected electrical equipment unit 1 is provided with a current detection section 7 to detect current flowing in the battery 5 and output the detected current signal at a fixed transmission period to the communication circuit 3 to transmit it to the remaining capacity computation apparatus 2, and a remaining capacity receiving section 8 to receive the remaining capacity signal input from the remaining capacity computation apparatus 2. Further, the connected electrical equipment unit 1 of the figure has a remaining capacity display section 9 to indicate remaining capacity of the battery 5, and this remaining capacity display section 9 displays the remaining capacity received by the remaining capacity receiving section 8. A connected electrical equipment unit 1 having a remaining capacity display section 9 is characterized by allowing the user to operate the electrical equipment while confirming the remaining battery capacity. However, the connected electrical equipment unit may also automatically switch its power off or begin a shutdown procedure when remaining capacity decreases below a set capacity, without having a remaining capacity display section.

The current detection section 7 is provided with a timer to specify the transmission period for output of detected current. The timer outputs a trigger signal at the fixed transmission period. As shown in the timing chart of FIG. 2, a detected current signal is output to the communication circuit 3 at a fixed transmission period (T1) whenever the trigger signal is issued. In the timing chart of the figure, the transmission period (T1) is 2 sec, and a detected current signal indicating charging current and discharging current flowing in the battery 5 is output at a rate of once every 2 sec. The detected current signal is output as an average current value over the transmission period or as the current value at transmission time. A system, in which the current detection section 7 outputs current over the transmission period as an average current, has the characteristic that remaining capacity can be accurately computed even when battery current varies over a period shorter than the transmission period. The current detection section 7 houses an analog-to-digital (A/D) converter to convert detected current to a digital signal, and charging current and discharging current are output to the communication circuit 3 as digital signals. The current detection section 7 makes the pulse width for output of a single detected current signal sufficiently small relative to the transmission period to establish a time interval of no current signal output within the transmission period. The current detection section 7 outputs positive and negative signals to the communication circuit 3 to distinguish between charging current and discharging current, or it transmits a signal which includes the sign to distinguish between charging current and discharging current.

Although the transmission period in the timing chart of the figure is 2 sec, the transmission period may be 100 msec to 10 sec. When the transmission period is short, remaining capacity can be accurately computed with variation in battery current. However, since all processing must be high-speed processing when the transmission period is shortened, component cost rises. Conversely, component cost can be reduced when the transmission period is lengthened. For a connected unit, such as electrical equipment with little variation in battery current, the transmission period can be lengthened and remaining capacity can be computed with relative accuracy.

The remaining capacity computation apparatus 2 is provided with a remaining capacity computation section 10 to operate on the detected current signal input from the connected electrical equipment unit 1 via the communication circuit 3 and compute remaining capacity of the battery 5, and a communication processing section 11 to output remaining battery capacity computed by the remaining capacity computation section 10 to the communication circuit 3 with prescribed timing to transmit the remaining capacity signal to the connected electrical equipment unit 1.

The remaining capacity computation section 10 computes remaining capacity by adding charge capacity to remaining capacity and subtracting discharge capacity from remaining capacity. Charge capacity is computed by multiplying the integrated value of charging current by charging efficiency. Discharge capacity computed by multiplying the integrated value of discharging current by discharging efficiency. The remaining capacity computation apparatus 2 of FIG. 1 is provided with a voltage detection section 12 to detect battery 5 voltage. In this remaining capacity computation apparatus 2 battery voltage is detected to use along with current in computing remaining capacity. A remaining capacity computation section 10 which also detects battery voltage to compute remaining capacity, can compute remaining capacity with greater accuracy. In particular, remaining capacity computed by integrating current can be corrected via battery voltage to compute remaining capacity with greater accuracy. Since there is a particular battery voltage or particular battery voltage characteristic when a battery 5 becomes completely discharged and remaining capacity becomes zero or when a battery reaches full charge and remaining capacity becomes 100%, battery voltage can be detected to accurately correct remaining capacity. Specifically, remaining capacity can be accurately corrected at complete discharge and at full charge. The battery 5 is a rechargeable battery (secondary battery) such as a lithium ion rechargeable battery, a nickel hydrogen battery, or a nickel cadmium battery. Since the voltage of a lithium ion rechargeable battery drops to a pre-set minimum voltage when the battery is completely discharged and rises to a pre-set maximum voltage when fully charged, 0% remaining capacity and 100% remaining capacity can be corrected by detecting voltage. For a nickel hydrogen battery or nickel cadmium battery, voltage drops to a set minimum voltage when completely discharged, and a peak voltage is reached at full charge followed by a ΔV voltage drop with further charging. Consequently, full charge can be determined by detecting peak voltage or measuring −ΔV.

Figure 2:
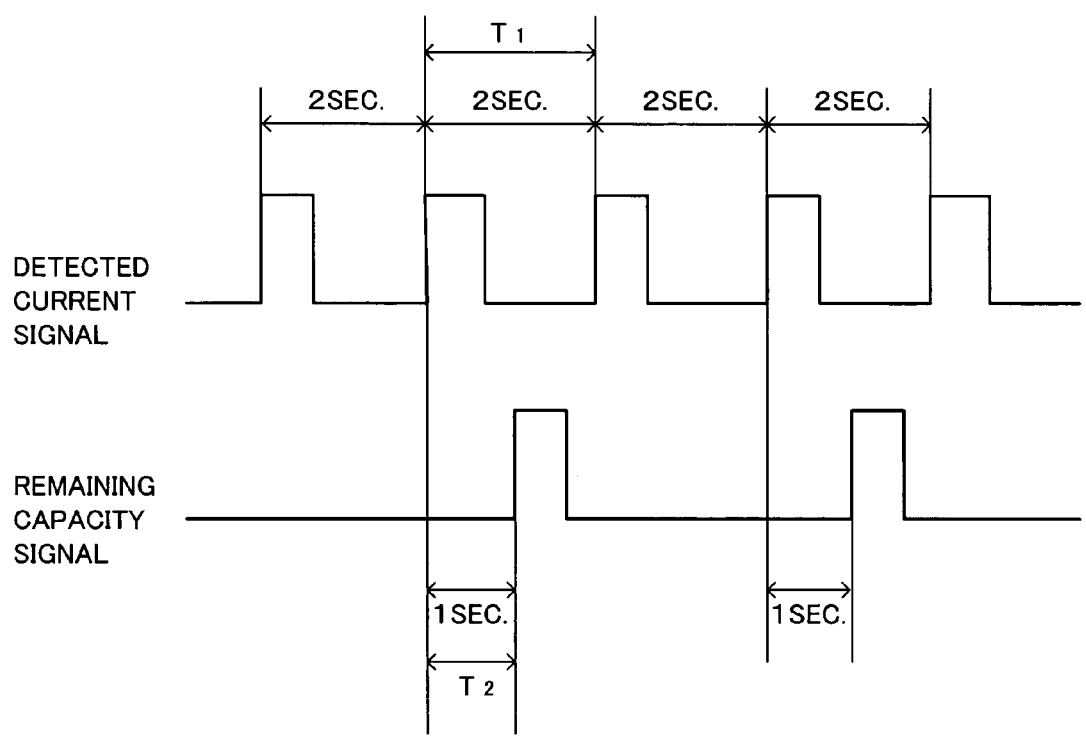
FIG. 2 is a timing chart showing timing for transmission of the detected current signal and the remaining capacity signal.

The communication processing section 11 outputs a signal indicating remaining capacity to the communication circuit 3 with the timing shown in FIG. 2. In this figure, the communication processing section 11 outputs a remaining capacity signal to the communication circuit 3, which is timed to occur after completion of the output of one detected current signal and before commencement of the output of the next detected current signal from the connected electrical equipment unit 1 to the communication circuit 3. This remaining capacity signal is transmitted to the connected electrical equipment unit 1 via the communication circuit 3. The communication processing section 11 is provided with a timer which stores timing information for output of the remaining capacity signal. This timer stores the delay time (T2) from the commencement of output of the detected current signal until output of the remaining capacity signal. Although not illustrated, the timer may also store the delay time from the completion of output of the detected current signal until output of the remaining capacity signal. As shown in the timing chart of FIG. 2, the delay time stored in the timer is set to allow transmission of the remaining capacity signal in the interval between detected current signals, or equivalently to avoid simultaneous transmission of the detected current signal and the remaining capacity signal. In the timing chart of FIG. 2, the delay time (T2) stored in the timer of the communication processing section 11 is set to half the transmission period (T1). By setting this delay time (T2), the remaining capacity signal can be output at the center region of the timing interval between detected current signals. However, the communication processing section 11 can output the remaining capacity signal with any timing that does not simultaneously transmit the remaining capacity signal and the detected current signal. The timer of the communication processing section 11 detects a detected current signal and begins counting; when the set time has elapsed, it issues a trigger signal. When the communication processing section 11 detects this trigger signal, it outputs a remaining capacity signal indicating the remaining capacity computed by the remaining capacity computation section 10 to the communication circuit 3.

The communication processing section 11 issues the remaining capacity signal to the communication circuit 3 at a rate of one remaining capacity signal per reception of one detected current signal, or per reception of a plurality of detected current signals. A communication processing section 11, which issues a remaining capacity signal after receiving a plurality of detected current signals, is provided with a counter which counts the number of detected current signals received and outputs a trigger signal when the count reaches a set value. This communication processing section 11 detects trigger signals output from both the counter and the timer to issue a remaining capacity signal. In addition, a communication processing section 11, which issues a remaining capacity signal after receiving a plurality of detected current signals, may also have a circuit configuration which detects both the timer's trigger signal and the remaining capacity signal input from the remaining capacity computation section 10 to issue a remaining capacity signal. This communication processing section 11 issues a remaining capacity signal when a remaining capacity signal is output from the remaining capacity computation section 10, and when a trigger signal is input from the timer.

In the timing chart of FIG. 2, a remaining capacity signal is output at a rate of one remaining capacity signal for every two detected current signals input. As shown in this timing chart, in a remaining capacity computation apparatus 2 which outputs one remaining capacity signal after inputting a plurality of detected current signals, the remaining capacity computation section 10 can take time in computing remaining capacity of the battery 5.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. A remaining battery capacity computation system comprising a remaining capacity computation apparatus being connected to an electrical equipment unit via a one line communication circuit, in which current flowing in the battery is detected by the connected electrical equipment unit, the detected current is transmitted to the remaining capacity computation apparatus via the communication circuit, the remaining capacity computation apparatus operates on the detected current transmitted via the communication circuit to compute remaining battery capacity, and the computed remaining capacity is transmitted to the connected electrical equipment unit via the communication circuit;

the connected electrical equipment unit having a current detection section which detects current flowing in the battery and outputs a detected current signal at a fixed transmission period to the communication circuit to transmit the detected current signal to the remaining capacity computation apparatus, and a remaining capacity receiving section which receives a remaining capacity signal input from the remaining capacity computation apparatus;

the remaining capacity computation apparatus having a remaining capacity computation section which operates on the detected current signal input from the connected electrical equipment unit via the communication circuit and computes remaining battery capacity, and a communication processing section which outputs the remaining capacity signal indicating the remaining battery capacity computed by the remaining capacity computation section to the communication circuit with prescribed timing to transmit the remaining capacity signal to the connected electrical equipment unit; and the communication processing section provided in the remaining capacity computation apparatus outputting the remaining capacity signal to the communication circuit, timed after completion of the output of one detected current signal and until commencement of the output of the next detected current signal from the connected electrical equipment unit to the communication circuit, for transmission of the remaining capacity signal to the connected electrical equipment unit.

2. A remaining battery capacity computation system as recited in claim 1 wherein the remaining capacity computation apparatus is housed in a battery pack which attaches to the connected electrical equipment unit in a detachable manner.

3. A remaining battery capacity computation system as recited in claim 1 wherein the connected electrical equipment unit has a remaining capacity display section, and this remaining capacity display section displays the remaining capacity received by the remaining capacity receiving section.

4. A remaining battery capacity computation system as recited in claim 1 wherein when remaining battery capacity drops below a set capacity, the connected electrical equipment unit switches power off.

5. A remaining battery capacity computation system as recited in claim 1 wherein when remaining battery capacity drops below a set capacity, the connected electrical equipment unit begins a shutdown procedure to switch power off.

6. A remaining battery capacity computation system as recited in claim 1 wherein the current detection section switches the detected current signal positive or negative to transmit charging current or discharging current to the remaining capacity computation apparatus via the communication circuit.

7. A remaining battery capacity computation system as recited in claim 1 wherein the current detection section outputs the detected current signal to the communication circuit with a transmission period of 100 msec to 10 sec.

8. A remaining battery capacity computation system as recited in claim 1 wherein the communication processing section outputs the remaining capacity signal to the communication circuit at a rate of one remaining capacity signal after receiving a plurality of detected current signals.

9. A remaining battery capacity computation system as recited in claim 1 wherein the communication processing section outputs the remaining capacity signal to the communication circuit at a rate of one remaining capacity signal after receiving one detected current signal.

10. A remaining battery capacity computation system as recited in claim 1 wherein the current detection section averages detected current over the transmission period and outputs average current to the remaining capacity computation apparatus via the communication circuit.

11. A remaining battery capacity computation system as recited in claim 1 wherein the current detection section outputs current at the time of transmission to the remaining capacity computation apparatus.

12. A remaining battery capacity computation system as recited in claim 1 wherein the current detection section houses an A/D converter, which converts detected current to a digital signal, and outputs charging current to the communication circuit as a digital signal.

13. A remaining battery capacity computation system as recited in claim 1 wherein the current detection section distinguishes charging current and discharging current by positive or negative sign, and outputs the detected current signal to the communication circuit.

14. A remaining battery capacity computation system as recited in claim 1 wherein the remaining capacity computation apparatus detects battery voltage and uses battery voltage as well as current to compute remaining capacity.

15. A remaining battery capacity computation system as recited in claim 1 wherein the communication processing section is provided with a timer which stores timing information for output of the remaining capacity signal.

16. A remaining battery capacity computation system as recited in claim 15 wherein the timer stores a delay time (T2) in memory which is the time from commencement of output of the detected current signal until output of the remaining capacity signal.

17. A remaining battery capacity computation system as recited in claim 15 wherein the timer stores a delay time in memory which is the time from completion of output of the detected current signal until output of the remaining capacity signal.

18. A remaining battery capacity computation system as recited in claim 15 wherein the timer in the communication processing section detects a detected current signal and begins counting, the timer outputs a trigger signal when a set time interval has elapsed, and the communication processing section detects the trigger signal and outputs a remaining capacity signal indicating the remaining capacity computed by the remaining capacity computation section to the communication circuit.

19. A remaining battery capacity computation system as recited in claim 15 wherein the communication processing section is provided with a counter which counts the number of detected current signals received and outputs a trigger signal when the count reaches a set number, and the communication processing section detects the trigger signals output from both the counter and the timer to output the remaining capacity signal.

20. A remaining battery capacity computation system as recited in claim 15 wherein the communication processing section detects both the remaining capacity signal input from the remaining capacity computation section and the timer's trigger signal to output the remaining capacity signal.

* * * * *